United States Patent
Kunugi et al.

[11] Patent Number: 6,137,118
[45] Date of Patent: Oct. 24, 2000

[54] VAPOCHROMIC PHOTODIODE

[75] Inventors: Yoshihito Kunugi, Hiroshima, Japan; Kent R. Mann, North Oaks, Minn.; Larry L. Miller, Minnetonka, Minn.; Marie K. Pomije, Prior Lake, Minn.

[73] Assignee: Regents of the University of Minnesota, Minneapolis, Minn.

[21] Appl. No.: 09/315,877

[22] Filed: May 20, 1999

Related U.S. Application Data

[63] Continuation-in-part of application No. 09/225,758, Jan. 5, 1999.

[51] Int. Cl.$^7$ ..................................................... H01L 35/24
[52] U.S. Cl. ............................................ 257/40; 257/431
[58] Field of Search ....................................... 257/40, 431

[56] References Cited

U.S. PATENT DOCUMENTS 5,629,533  5/1997  Ackley et al. ............................. 257/80

OTHER PUBLICATIONS

Kunugi et al, "A Vapochromic Photodiode", *Chem. Mater.,* vol. 10, No. 6, pp. 1487–1489, (1998).

C.L. Exstrom et al, "Inclusion of Organic Vapors by Crystalline, Solvatochromic [Pt(aryl isonitrile)$_4$][Pd(CN)$_4$] Compounds", *Chemical Materials,* vol. 7, pp. 15–17 (1995).

C.A. Daws et al, "Vapochromic Compounds as Environmental Sensors" *Chemical Materials,* vol. 9, pp. 363–368 (1997).

R.H. Friend, "Conjugated Polymers and Related Materials", W.R. Salaneck et al, Eds., Chapter 21, Oxford University Press (1993).

Y. Yang, "Polymer Electroluminescent Devices", *MRS Bulletin,* pp 31–38 (Jun. 1997).

T. Tsutsui, "Progress in Electroluminescent Devices Using Molecular Thin Films", *MRS Bulletin,* pp. 39–45 (Jun. 1997).

Ghosh et al, "Photovoltaic And Rectification Properties of Al/Mg Phthalocyanine/Ag Schottky–Barrier Cells", *Journal of Applied Physics,* vol. 45, No. 1, pp. 230–236, Jan. 1974.

Harima et al, "Spectral Sensitization In An Organic p–n Junction Photovoltaic Cell", *Appl. Phys. Lett.,* vol. 45, No. 10, pp. 1144–1145, Nov. 15, 1984.

W.R. Salaneck et al, "Conjugated Polymer Surfaces and Interfaces for Light–Emitting Devices", *MRS Bulletin,* pp. 46–51 (Jun. 1997).

C.L. Exstrom, "Structural Characterization of Iridium 1,8–Diisocyanomenthane Complexes and the Effects of Guest Molecule Inclusion on the Structure and Spectroscopy of Organometallic Stacking Materials", Ph.D. Dissertation, University of Minnesota, 1995.

Kunugi et al, "A Vapochromic LED", *J. A. Chem. Soc.,* vol. 120, pp. 589–590 (1998).

(List continued on next page.)

*Primary Examiner*—Olik Chaudhuri
*Assistant Examiner*—Douglas A. Wille
*Attorney, Agent, or Firm*—Benman & Collins

[57] ABSTRACT

A sandwich-type, organic p-n junction photodiode is prepared by electrode-position of an insoluble layer of oligomerized tris(4-(2-thienyl)phenyl)amine onto conducting indium-tin oxide coated glass, spin-coating the stacked platinum compound, bis(cyanide)-bis(para-dodecylphenylisocyanide)platinum (II), from chloroform onto the oligomer layer, and then coating the platinum complex with a micro-array of aluminum electrodes by vapor deposition. This device shows rectification of current and gives a measurable photocurrent. The photocurrent action spectrum follows the absorption spectrum of the platinum complex; changes in the action spectrum with layer thickness point to a p-n junction formed at the interface of the molecular layers as the site of rectification. Exposure of the device to acetone vapor causes the action spectrum to shift dramatically to longer wavelength. Exposure to chloroform vapor causes a return to the original spectrum. These results demonstrate a new type of photosensor that reports the arrival of organic vapors.

7 Claims, 5 Drawing Sheets

OTHER PUBLICATIONS

Yonehara et al, "Dark And Photoconductivity Behavior of $C_{60}$ Thin Films Sandwiched With Metal Electrodes", *Appl. Phys. Lett.,* vol. 61, No. 5, pp. 575–576, Aug. 3, 1992.

Yu et al, "Semiconducting Polymer Diodes: Large Size, Low Cost Photodetectors With Excellent Visible–Ultraviolet Sensitivity", *Appl. Phys. Lett.* vol. 64, No. 25, pp. 3422–3424, Jun. 20, 1994.

Kunugi et al, "Photodiodes Utilizing Polyesters That Contain Different Colored Oligothiophenes In The Main Chain", *Chemistry of Materials,* vol. 9, No. 5, pp. 1061–1062 May 1997.

Hosokawa et al, "Organic Multi–Color Electroluminescence Display With Fine Pixels", *Synthetic Metals,* vol. 91, pp 3–7 (1997).-

VAPOCHROMIC PHOTODIODE

CROSS-REFERENCE TO RELATED APPLICATION

The present application is a continuation-in-part of application Ser. No. 09/225,758, filed Jan. 5, 1999, entitled "A Vapochromic LED". That application is directed to molecular light emitting diodes based on thin films of certain platinum complexes.

The Government has certain rights in this invention, pursuant to grants (NSF/CHE/9216003 and NSF/CHE/9307837) from the National Science Foundation.

TECHNICAL FIELD

The present invention relates generally to molecular electronics, and, more particularly, to vapor-sensitive, molecular photodiodes based on thin films of certain platinum complexes.

BACKGROUND ART

The inventors have recently published reports that have enucleated and explained the unusual "vapochromic" changes in absorption and emission spectra that result when certain stacked platinum complexes are exposed to organic vapors; see, e.g., C. L. Exstrom et al, *Chemical Materials*, Vol. 7, pp. 15–17 (1995) and C. A. Daws et al, *Chemical Materials*, Vol. 9, pp. 363–368 (1997).

Figure 1A:
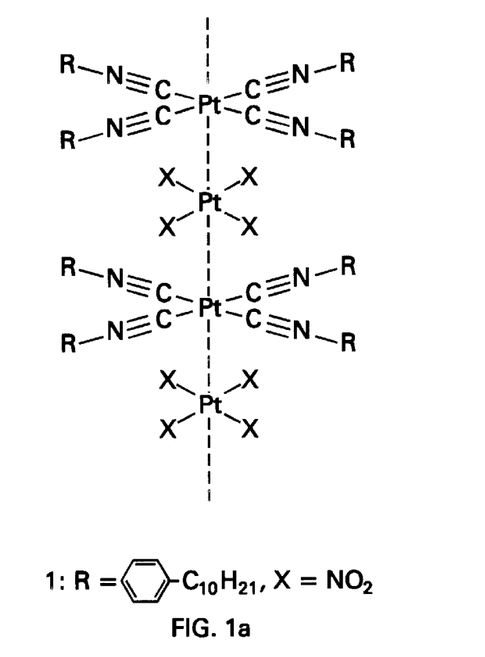
FIGS. 1a–1b depict the basic formulae of certain platinum complexes, specifically, tetrakis(p-decylphenylisocyano) platinum tetracyanoplatinate (Compound 1) and bis (cyanide)-bis(p-dodecylphenylisocyanide) platinum (II) (Compound 2) employed in the practice of the present invention.

A typical experiment involves a solution, crystal or solid film of material, such as tetrakis(p-decylphenylisocyano) platinum tetracyanoplatinate (I) (see FIG. 1, which depicts the chemical formula of the compound, where the dashed vertical line indicates the c-axis) that forms stacks of alternating cations and anions with strong interplatinum interactions. These salts exhibit an intense absorption band in the visible region. Exposing the stacks to small molecule vapors, such as acetone or chloroform, leads to sorption of the vapor molecules in the free volume between the stacks, and produces shifts in the absorption and emission spectra. These "vapochromic" or "vapoluminescent" changes are usually reversible so that the original spectrum is regained quickly after the vapor is removed. Such an effect has potential application for sensor technology.

The inventors developed a new type of sensor technology, called the "vapo-chromic LED"; see, Y. Kunugi et al, *Journal of the American Chemical Society*, Vol. 120, pp. 589–590 (January 1998) and application Ser. No. 09/225,758, listed above.

A sandwich LED was prepared using compound 1 that gave electroluminescence from this platinum compound; see, e.g., R. H. Friend et al in *Physical Properties of Polymers Handbook*, J. E. Mark, Ed., AIP Press (1996); Y. Yang, *MRS Bulletin*, pp. 31–38 (June 1997); T. Tsutsui, *MRS Bulletin*, pp. 39–45 (June 1997); W. R. Salaneck et al, *MRS Bulletin*, pp. 46–51 (June 1997); and C. Hosokawa et al, *Synth. Met.*, Vol. 91, pp. 3–7 (December 1997). Exposure of the device to an organic vapor sharply changed the wavelength of electroluminescence, thereby providing a new method for remote vapochromic sensing which does not require a light source.

On the other hand, photodiodes, which do require a light source, have found extensive use in the electronics industry. Organic and polymer photodiodes have been built using materials such as poly(3-alkylthiophene)s, oligothiophenes, and $C_{60}$. These photodiodes give photocurrents corresponding to the absorption of light by the molecular materials. They are of interest because they can give wavelength selectivity and quantum efficiencies of more than 10% electron/photon under modest reverse bias; see, e.g., H. Yonehara et al, *Applied Physics Letters*, Vol. 61, pp. 575–576 (August 1992); G. Yu et al, *Applied Physics Letters*, Vol. 64, pp. 3422–3424 (June 1994); and Y. Kunugi et al, *Chemical Materials*, Vol. 9, pp. 1061–1062 (May 1997).

However, to the best of the present inventors' knowledge, a photodiode which can detect the arrival of organic vapors has not been described. Such a device would be of interest in detecting the presence of organic vapors by a change in photocurrent.

DISCLOSURE OF INVENTION

In accordance with the present invention, a molecular photodiode is provided. The molecular photodiode employs an organic complex that acts as both a sensor to certain organic molecules, or analyte vapors, and as an active light emitter. The molecular photodiode of the present invention comprises:

(a) a first electrode;

(b) a first molecular layer formed on the first electrode, capable of at least transporting charge;

(c) a sensing/emitting layer formed on the first electrode, the sensing/emitting layer comprising a material that changes color upon exposure to the analyte vapors and that forms a rectifying junction with the first molecular layer; and (d) a second electrode formed on the sensing/emitting layer, wherein at least the first electrode comprises an optically transparent material. The device is preferably formed on a transparent dielectric substrate, on which the first electrode is formed.

Also in accordance with the present invention, a method is provided for detecting analyte vapors. The method comprises:

(a) providing the above-described vapochromic photodiode;

(b) applying a voltage to the two electrodes in the range of 0 to about 50 V;

(c) shining light on the device in the wavelength range of about 300 to 1,000 nm;

(d) introducing the analyte vapors to the sensing layer; and (e) measuring the photocurrent prior to and subsequent to exposure of the device to the analyte vapors to obtain a change in the photocurrent.

Further in accordance with the present invention, methods are provided for forming the vapochromic photodiode.

Other objects, features, and advantages of the present invention will become apparent upon consideration of the following detailed description and accompanying drawings, in which like reference designations represent like features throughout the FIGURES. The drawings referred to in this description should be understood as not being drawn to scale except if specifically noted.

BRIEF DESCRIPTION OF THE DRAWINGS

FIG. 3b is a top plan view of the molecular photodiode depicted in FIG. 3a;

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

Herein is described a vapochromic photodiode based on chemical and electrical effects related to those involved in the LED disclosed and claimed in the related application, Ser. No. 09/225,758.

To the knowledge of the present inventors, a photodiode which can detect the arrival of organic vapors has not been heretofore described. In accordance with the present invention, such a photodiode comprises an electrode transparent to the incident light, a second molecular layer that forms a rectifying junction with an emitter layer, a third layer of an appropriate vapochromic material that functions as the emitter layer, and a second electrode that permits vapor to reach the molecular materials.

Figure 1B:
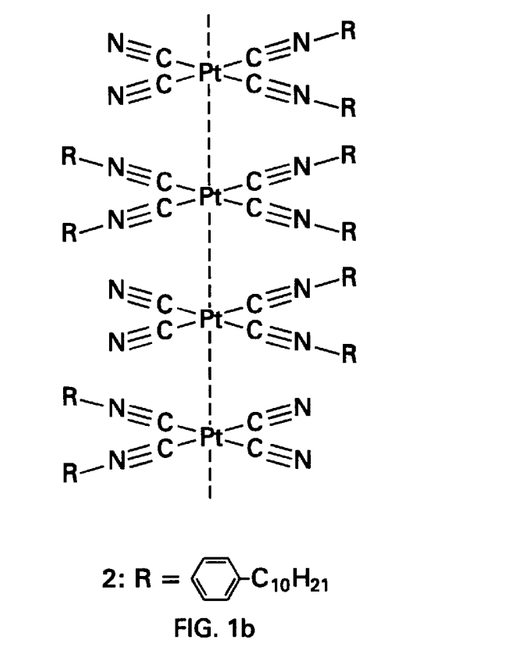

Bis(cyanide)-bis(p-dodecylphenylisocyanide) platinum (II) (Compound 2, FIG. 1b) was chosen as the stacked platinum complex because it forms good films by spin casting and it exhibits a large color change in response to organic vapors. This complex was disclosed by C. L. Exstrom, Ph.D. Dissertation, University of Minnesota (1995). Compound 2 was prepared by a melt method, as disclosed by Exstrom, supra. Tetrakis(p-decylphenylisocyano)platinum tetracyanoplatinate, from C. A. Daws et al, supra, (1.785 g, 1.20 mmoles) was placed in a flask and left under an argon atmosphere. As the deep blue sample was slowly heated to 165° C., the solid melted forming a reddish brown liquid. Upon cooling, the liquid solidified. The resulting solid was extracted from the flask with dichloromethane and purified by column chromatography with 17:3 dichloromethane:ethyl acetate (1.526 g, 2.08 mmoles, 87% yield). The purified product gave appropriate combustion analysis and spectroscopic data, as listed by Exstrom, supra.

Figure 2:
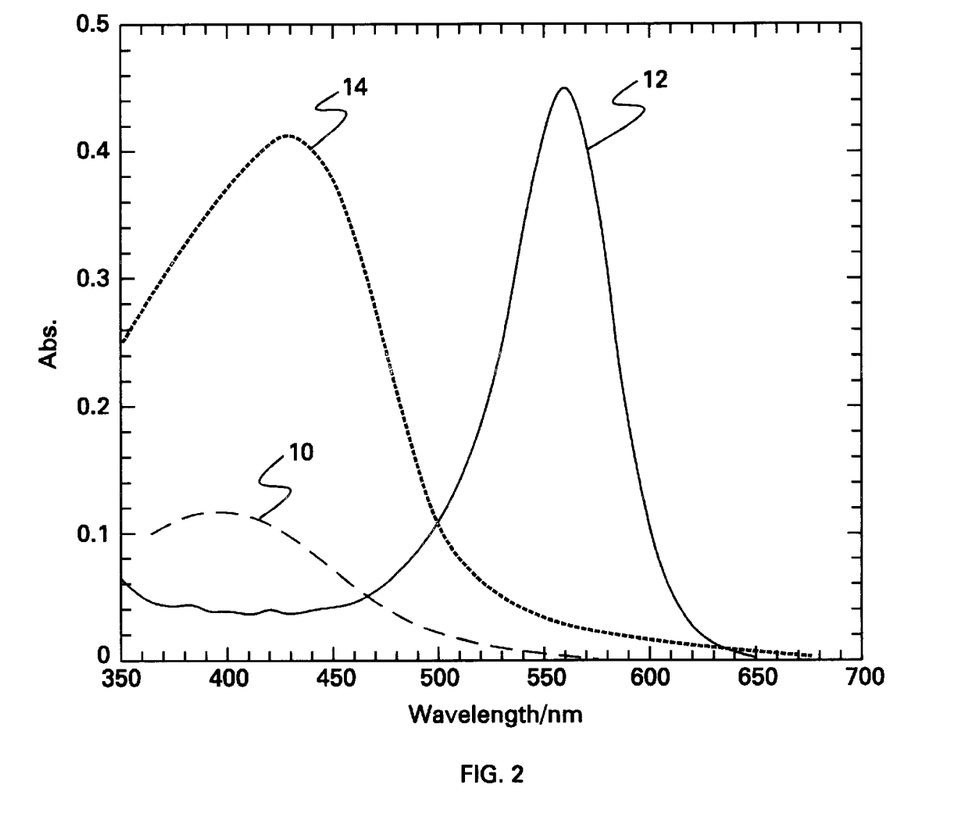
FIG. 2, on coordinates of intensity (in arbitrary units) and wavelength (in nm), is a plot of the absorption spectra of (a) Compound 2 before exposure to acetone vapor, (b) Compound 2 after exposure to acetone vapor, and (c) Compound 3.

The color of the film cast from chloroform solution was yellow ($\lambda_{max}$: 400 nm); see Curve 10 in FIG. 2. Exposure of the film to acetone vapor changed the color to reddish-purple $\lambda_{max}$: 560 nm); see Curve 12 in FIG. 2. This reddish-purple color was 10 stable for several months under ambient laboratory conditions, but could be switched back to yellow by exposure to chloroform or dichloromethane vapor. Devices were prepared by spin casting Compound 2 from chloroform solution onto electrically-conducting indium-tin oxide (ITO) coated glass, followed by vapor deposition of aluminum. These devices, like single layer devices formed from Compound 1 (FIG. 1a) and reported by Y. Kunugi et al, supra, were very resistive, unstable, and did not show rectification.

Figure 1C:
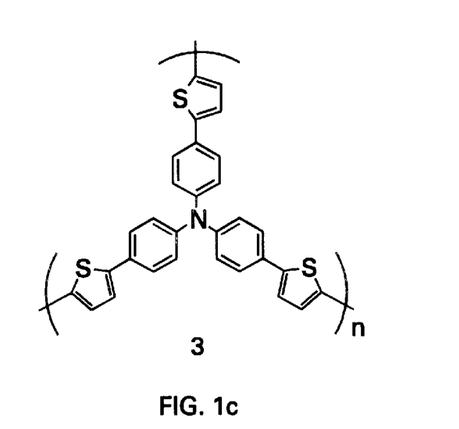
FIGS. 1c–1d depict film-forming, light-emitting compounds (not vapochromic) that are useful in the practice of the invention, in which Compound 3 is an oligomer of Compound 4 (tris(-2-thienyl)phenyl)amine)
Figure 1D:
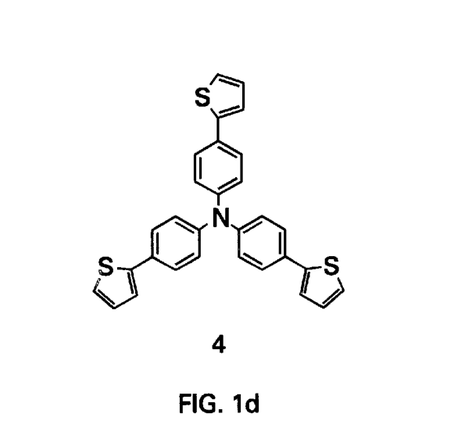

Recently, the inventors have shown that electrochemical oligomerized tris(4(2-thienyl)phenyl)amine (Compound 3, FIG. 1c) can be used as a hole transport layer to make a two-layer device; see, Y. Kunugi et al, supra. Because the layer of Compound 3 is insoluble in solvents such as chloroform or acetone, it was possible to spin cast a layer of Compound 2 on top of Compound 3 without layer interdiffusion. The two-layer device ITO/3/2/Al was, therefore, prepared by anodically oxidizing tris(p-thienylphenyl)amine (Compound 4, FIG. 1d) in acetonitrile, lithium perchlorate providing the oxidized form of Compound 3, and then electrochemically reducing it to form the neutral Compound 3 (film thickness=200 nm). The absorption spectrum of Compound 3 as a function of wavelength is depicted in FIG. 2, Curve 14. After drying, a layer of Compound 2 (film thickness=250 nm) was spin-cast from chloroform on top of Compound 3, and then aluminum (150 nm thick) was vapor deposited through a mask onto Compound 2. To insure a quick response to the vapor, the aluminum electrode was fabricated as fingers spaced apart by 0.1 mm (FIGS. 3a–3b).

Figure 3A:
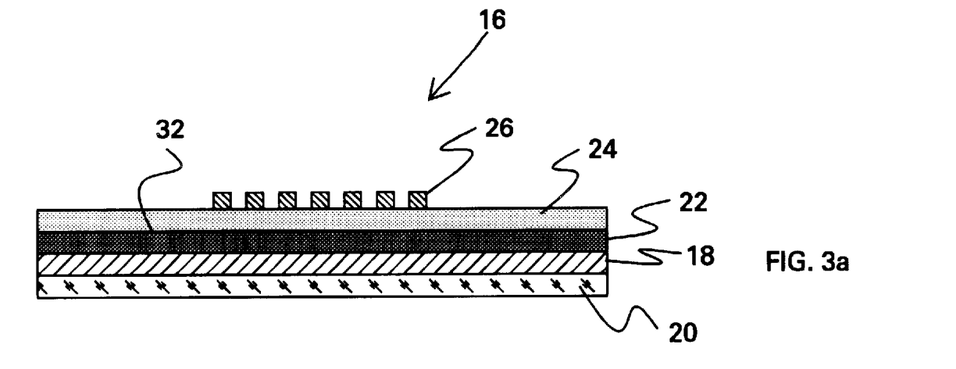
FIG. 3a is a side elevational view of the molecular photodiode of the present invention, using two separate layers, one for bis(cyanide)-bis(p-dodecylphenylisocyanide) platinum (II) (Compound 2) and one for electrically oligomerized tris(4-(2-thienyl)phenyl)amine (Compound 3)
Figure 3B:
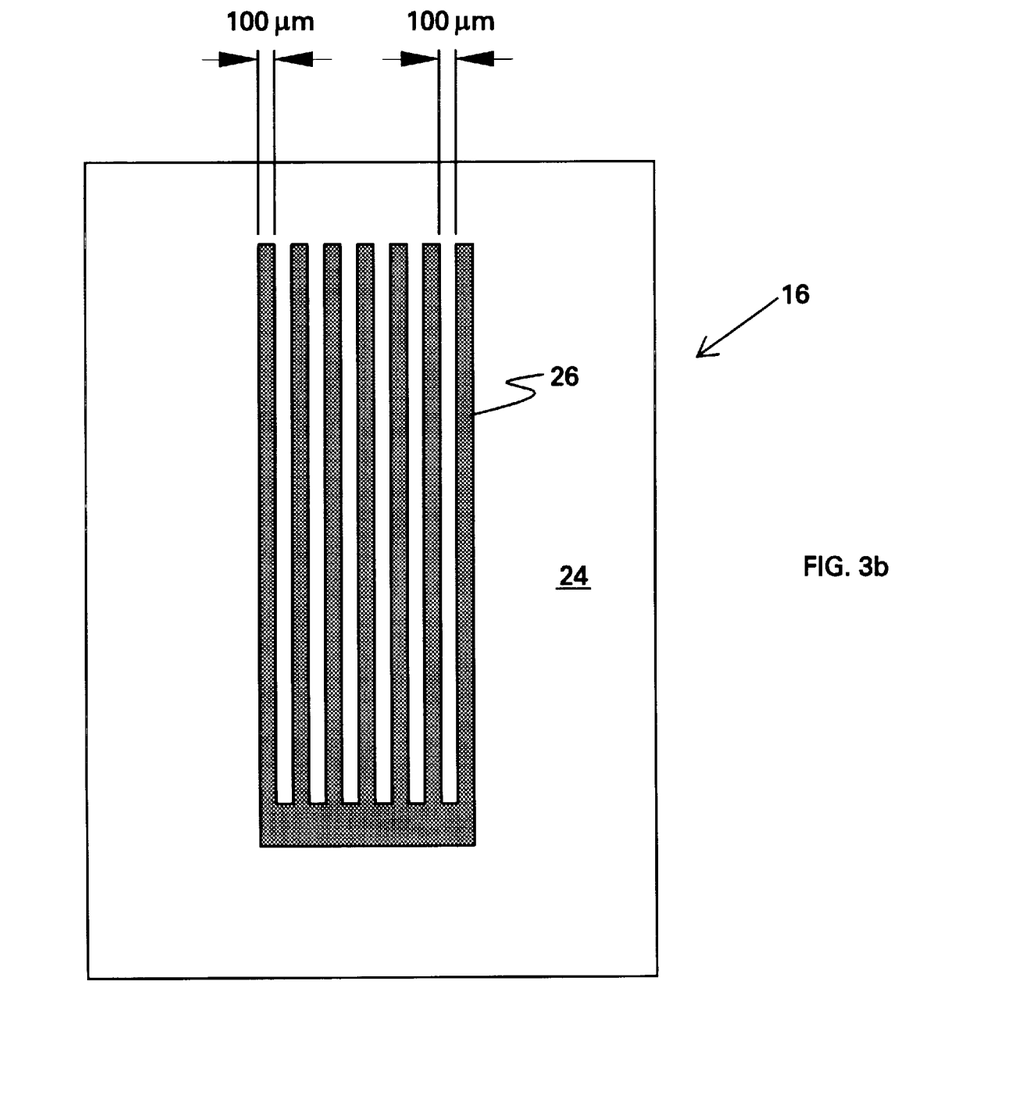

FIGS. 3a–3b depict one embodiment of the vapochromic photodiode 16 of the present invention. The transparent indium tin oxide (ITO) layer 18 is formed on a transparent substrate 20. A layer 22 of Compound 3 is formed on the ITO layer 18. A layer 24 of Compound 2 is formed on the layer 22. An aluminum electrode 26 is formed on the top of the layer 24.

The transparent electrode 18 may comprise indium tin oxide or polyaniline, while the second electrode 26 may comprise aluminum, magnesium, calcium, or silver.

The molecular layers 22 and 24 are typically less than 1,000 nm thick.

Figure 4:
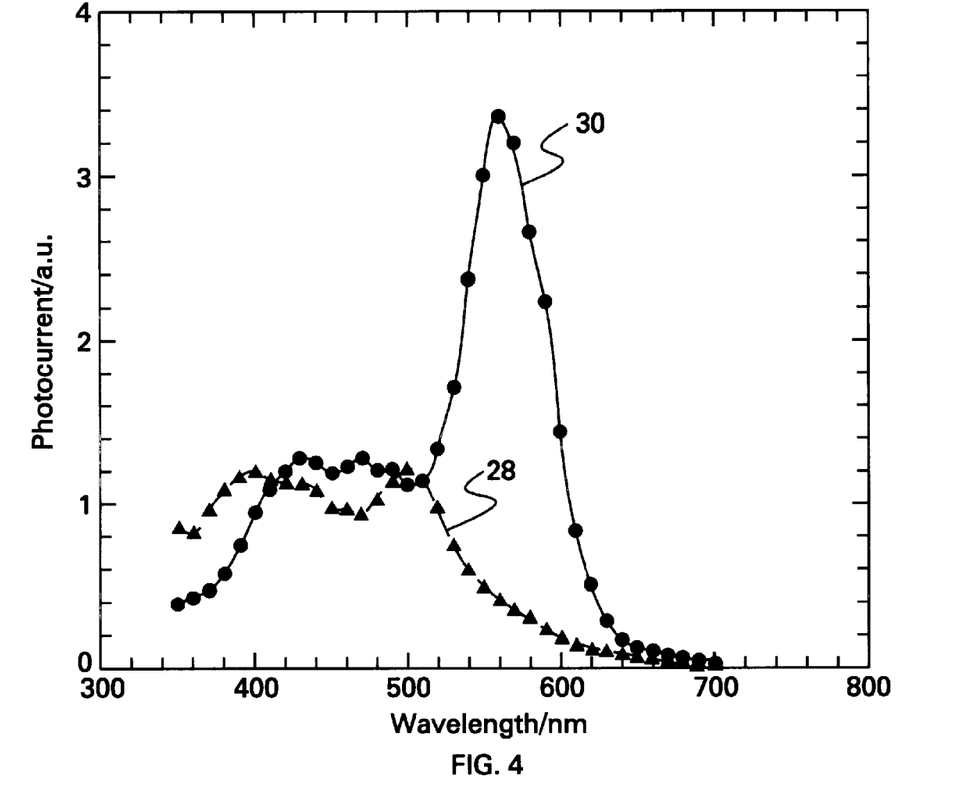
FIG. 4, on coordinates of photocurrent (in arbitrary units) and wavelength (in nm), is a plot depicting the action spectra for the ITO/Compound 3/Compound 2/Al photodiode cell of FIGS. 3a–3b (a) before exposure to acetone and (b) after exposure to acetone.

The device ITO/3/2/Al gave rectification (rectification ratio 100 at±5 V) of the current favoring electron flow from Al 26 through the molecular layers 24, 22 to ITO 18. For photocurrent action spectra, a 450 W Xe lamp was used, and the photo-current was normalized to account for the variation of lamp output with wavelength. A calibrated silicon photodiode was used to measure light intensities. The photocurrent action spectrum of the device ITO/3/2/Al has a broad peak between 400 and 500 nm (Curve 28 of FIG. 4). Exposure to argon saturated with acetone vapor gave a shifted action spectrum (Curve 30 of FIG. 4) ($\lambda_{max}$: 560 run), corresponding to the shifted absorption spectrum of Compound 2 (Curve 12 of FIG. 2). This spectrum was stable in air in the absence of acetone vapor. Exposure of the device to chloroform vapor in argon (or air) caused the spectrum to revert to the original. The shapes of these spectra are independent of light intensity. Illuminated through ITO with 560 nm light (1.0 mW cm$^{-2}$), the quantum efficiency (electron/photon of absorbed light) of the device 16 was 0.03% at 0 V and 16.5% at 20 V reverse bias. It is noted that Compound 2 is visibly photoluminescent and so at low bias voltages, emission of light can effectively compete with charge separation and photocurrent generation.

Figure 5:
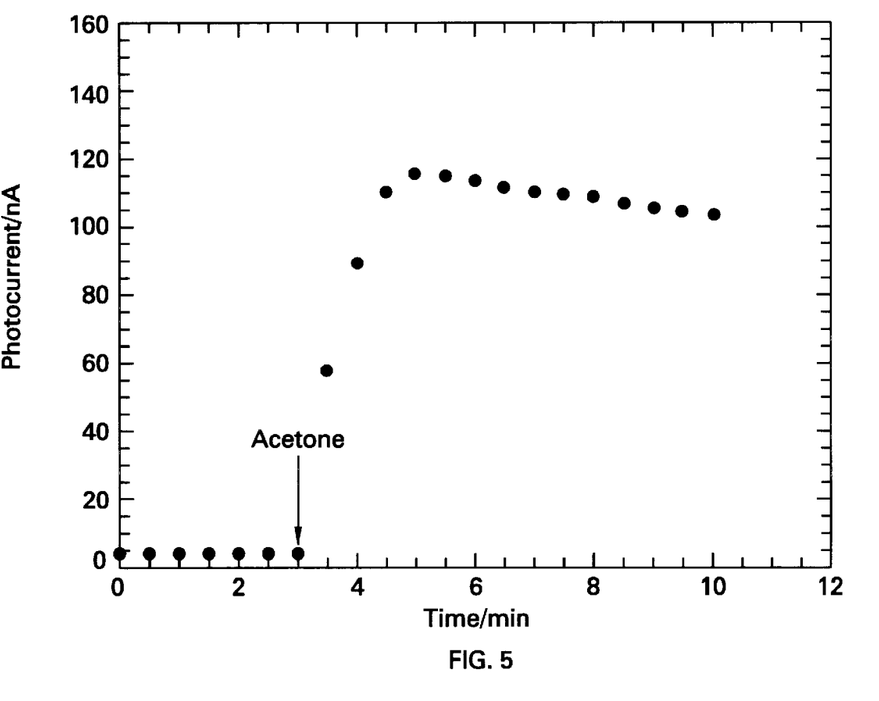
FIG. 5, on coordinates of photocurrent (in arbitrary units) and wavelength (in nm), is a plot depicting the time dependence of the photocurrent for the ITO/3/2 photodiode cell of FIGS. 3a–3b illuminated with 560 nm light.

The known instability of polymer-based electro-optical devices during operation in air is not such a severe problem for sensors. As a sensor, the device 16 only needs to be pulsed occasionally to check for the arrival of the vapor of interest and so operating times can be quite short. In the present case, the photocurrent decayed 40% during continuous operation in air. When pulsed, the response was much more stable and this allowed measurement of the time dependence of switching. The photcurrent for the ITO/3/2/Al cell 16 illuminated with 2 sec pulses of 560 nm light is shown in FIG. 5. When acetone vapor in argon was introduced above the device 16, the photo-current increased more than 10 times in 2 min. This response time is much faster than that for previously-reported vapochromic LED (Y. Kunugi et al, supra). This seems to be a result of the use of the microelectrode array 26, instead of relying on the slower diffusion through a porous aluminum layer.

Of interest in terms of mechanism is the action spectrum between 400 and 500 nm (FIG. 4), which does not correspond closely with the absorption spectra of either Compound 2 or Compound 3 (FIG. 2). To understand this difference, a device with a thicker layer of Compound 3 was prepared. The efficiency of this device was smaller at all wavelengths, but especially between 350 and 460 nm. The weaker action spectrum between 500 and 700 nm still followed the absorption spectrum of Compound 2. These effects appear to result because the active interface is that between Compound 2 and Compound 3, and because Compound 3 acts as an optical filter; see, e.g., A. K. Ghosh et al, *Journal of Applied Physics*, Vol. 45, pp. 230–236 (January 1974) and Y. Harima et al, Applied Physics Letters, vol. 45, pp. 1144–1145 (November 1984). If the ITO/3 interface is not active, then the thicker layer of compound 3 only acts to attenuate the light reaching the region near the active 3/2 interface 32. A p-n junction is formed at the 3/2 interface 32 and the organic layers, especially Compound 2, absorb light and give charge separation near this interface.

These results demonstrate a new class of gas sensors that report the arrival of organic vapors by a change in photocurrent. In one sense, these photodiodes are like vapochromic absorption sensors without the requirement for a separate detector of the absorbed light. Since different platinum complexes and/or organic vapors will elicit different optical responses, a variety of chemicals can be detected and there are many opportunities for improving and fine tuning device performance.

INDUSTRIAL APPLICABILITY

The photodiodes of the present invention are expected to find use in the detection of vapors.

Thus, there has been disclosed a vapochromic photodiode. It will be readily apparent to those skilled in this art that various changes and modifications of an obvious nature may be made, and all such changes and modifications are considered to fall within the scope of the present invention, as defined by the appended claims.

What is claimed is:

1. A molecular photodiode that changes colors as a function of analyte vapors comprising:
    (a) a first electrode;
    (b) a first molecular layer formed on the first electrode capable of at least transporting charge;
    (c) a sensing/emitting layer formed on the first electrode, the sensing/emitting layer comprising a material that changes color upon exposure to the analyte vapors and that forms a rectifying junction with the first molecular layer; and
    (d) a second electrode formed on the sensing/emitting layer, wherein at least the first electrode comprises an optically transparent material and wherein an application of voltage to both electrodes and exposure of said photodiode to light results in a change in photocurrent in the presence of an organic vapor.

2. The molecular photodiode of claim 1 further including means for introducing said analyte vapors to said sensing layer.

3. The molecular photodiode of claim 1 further including an optically transparent dielectric substrate on which at least one said photodiode is formed, with said first electrode formed on said substrate.

4. The molecular photodiode of claim 3 further comprising an optical fiber coupled to said substrate for transmitting light emitted by said photodiode.

5. The molecular photodiode of claim 1 wherein said first electrode comprises an optically transparent material selected from the group consisting of indium tin oxide and polyaniline.

6. The molecular photodiode of claim 1 wherein said second electrode comprises at least one metal selected from the group consisting of aluminum, magnesium, calcium, and silver.

7. The molecular photodiode of claim 1 further comprising means for biasing said first electrode positive with respect to said second electrode.

* * * * *

UNITED STATES PATENT AND TRADEMARK OFFICE
CERTIFICATE OF CORRECTION

PATENT NO : 6,137,118
DATED : October 24, 2000
INVENTOR(S) : Yoshihito Kunugi, et al.

It is certified that error appears in the above-identified patent and that said Letters Patent are hereby corrected as shown below:

at column one, line 13, after "9307837)", insert --and the Massachusetts of Technology # MIT/CC-S-588180/LITCO/DE (DOE Prime #DE-AC07-94ID13225)--

Signed and Sealed this

Eighth Day of May, 2001

Attest:

NICHOLAS P. GODICI

Attesting Officer

Acting Director of the United States Patent and Trademark Office